United States Patent
Blodorn et al.

(10) Patent No.: US 8,274,782 B2
(45) Date of Patent: Sep. 25, 2012

(54) MOTOR CONTROL CENTER NETWORK CONNECTIVITY METHOD AND SYSTEM

(75) Inventors: Keith Brian Blodorn, Menomonee Falls, WI (US); David Lee Jensen, Barneveld, WI (US)

(73) Assignee: Rockwell Automation Technologies, Inc., Mayfield, OH (US)

( * ) Notice: Subject to any disclaimer, the term of this patent is extended or adjusted under 35 U.S.C. 154(b) by 183 days.

(21) Appl. No.: 12/895,167

(22) Filed: Sep. 30, 2010

(65) Prior Publication Data

US 2012/0081841 A1   Apr. 5, 2012

(51) Int. Cl.
*H02B 1/26* (2006.01)
*H05K 13/00* (2006.01)

(52) U.S. Cl. ........ 361/622; 361/605; 361/614; 361/616; 361/624; 361/627; 700/292; 700/293; 700/296; 340/638; 340/639; 312/223.1; 312/223.2; 312/236; 312/296; 312/329; 702/62; 702/65; 29/592.1

(58) Field of Classification Search .......... 361/23, 361/24, 30–33, 62, 64, 96, 115, 172, 601–624, 361/630–636, 640, 673; 700/12, 19, 72, 700/63, 83, 292–296; 340/524, 525, 638, 340/639, 825.06, 825.16–17; 312/223.1, 312/223.2, 236, 296, 283, 329, 107, 111, 312/199, 213; 439/95, 638; 29/592.1; 702/62, 702/65; 200/500, 501, 318–327, 43.16, 43.19, 200/308
See application file for complete search history.

(56) References Cited

U.S. PATENT DOCUMENTS

| | | | |
|---|---|---|---|
| 3,142,003 A * | 7/1964 | Olashaw | 361/608 |
| 4,768,967 A * | 9/1988 | Fritsch | 439/152 |
| 5,905,631 A * | 5/1999 | Winkler | 361/641 |
| 6,445,332 B1 * | 9/2002 | Younger et al. | 341/176 |
| 6,487,091 B2 * | 11/2002 | Malkowski et al. | 361/826 |
| 6,727,442 B2 * | 4/2004 | Byron et al. | 200/50.27 |
| 6,795,320 B2 * | 9/2004 | Malkowski et al. | 361/826 |
| 7,034,662 B2 | 4/2006 | Brandt et al. | |
| 7,049,514 B2 | 5/2006 | Brandt et al. | |
| 7,063,572 B2 | 6/2006 | Brandt et al. | |
| 7,173,345 B2 | 2/2007 | Brandt et al. | |
| 7,417,848 B2 | 8/2008 | Bergmann et al. | |
| 7,419,394 B2 | 9/2008 | Jensen et al. | |
| 7,511,946 B2 | 3/2009 | Malkowski, Jr. et al. | |
| 7,525,809 B2 * | 4/2009 | Bergmann et al. | 361/752 |
| 7,528,612 B2 * | 5/2009 | Gollhardt et al. | 324/530 |
| 7,561,412 B2 * | 7/2009 | Brandt et al. | 361/616 |
| 7,564,341 B2 | 7/2009 | Brandt et al. | |
| 7,684,199 B2 * | 3/2010 | Yee et al. | 361/725 |
| 7,965,493 B2 * | 6/2011 | Leeman et al. | 361/608 |
| 8,144,438 B2 * | 3/2012 | Rivers et al. | 361/23 |

* cited by examiner

*Primary Examiner* — Michail V Datskovskiy
(74) *Attorney, Agent, or Firm* — Fletcher Yoder, P.C.; Alexander R. Kuszewski; John M. Miller (57) ABSTRACT

A motor control center comprises a plurality of bays in which switchgear components, circuit protective components, automation components and power electronic components are disposed for driving motors and other loads. Network optical conductors are routed through one or more wireways adjacent to the bays. Distribution nodes are coupled to the conductors and are interconnected with respective network terminals within the bays. Components within individual bays for which EtherNet and/or Internet connectivity is desired are coupled to the network terminals. The conductors may comprise plastic optical fibers and may be designed to operate in the relatively high voltage environment of the motor control center bays.

20 Claims, 6 Drawing Sheets

MOTOR CONTROL CENTER NETWORK CONNECTIVITY METHOD AND SYSTEM

BACKGROUND

The present invention relates generally to the field of motor control centers and similar power electronic systems, and more particularly to novel techniques for providing EtherNet and Internet connectivity in such devices.

Motor control centers (MCCs) are common throughout a range of industrial and automation applications. In general, although referred to as motor control centers, these devices group a range of equipment for a variety of electric loads, and commonly include switchgear, automation control equipment, and supporting circuits into manageable cabinets that can be positioned at various locations around a controlled machine or process. The cabinets typically include individual compartments or bays that can be accessed through lockable doors. Because the components within MCCs often regulate application of three-phase power to loads, access to the interior of the bays, and routing of data within the devices needs to be specially controlled and adapted for the high voltage environment.

In conventional MCCs three-phase power is typically routed to the switchgear and control devices through bus bars that extend horizontally and vertically in a backplane of the cabinet. The component bays can plug into these bus bars to draw power from a line side supply, typically connected to the utility grid. Controlled output power for various loads, such as electric motors, may be routed through dedicated wireways in various areas of the cabinet. A particular challenge entails the routing of data within the enclosures and between the components within the various bays. Conventional MCCs often utilize open industrial data exchange protocols that have dedicated physical media for the exchange of data used for control, reporting, and other purposes.

While these approaches have been largely sufficient in the past, standardization on more commonly available protocols is necessary. For example, components have, in the past, been adapted for communication in accordance with specific industrial protocols, with chip sets, software and firmware specifically adapted for these. The data exchange media in the MCC cabinet has similarly been adapted according to industrial standards. Little or no development, however, has been made for Internet-based connectivity and particularly for connectivity using a standard EtherNet protocol. Problems persisting in the area relate to how most efficiently to distribute the Internet or EtherNet communications within MCC cabinets, making it available for individual components within individual bays. There is a need, therefore, for improved connectivity solutions that can allow for the use of Internet and EtherNet protocols in the context of MCCs.

BRIEF DESCRIPTION

The invention provides novel solutions directed to these needs. In particular, the invention allows for the routing of Internet and EtherNet protocol media within MCC enclosures to permit interfacing with power electronic and other components within a relatively high voltage environment. Moreover, the invention allows for routing of such data media within individual bays of MCCs, where desired.

In accordance with one aspect of the invention, a motor control center comprises a cabinet subdivided into a plurality of bays and wireways. The bays are configured to house power electronic components that receive power from a source and control application of power to one or more loads, while the wireways are configured to channel data and power conductors to the bays. Wireway optical network conductors are disposed a wireway for conducting data during operation. At least one distribution node is coupled to the wireway optical network conductors. Distribution optical network conductors are coupled to the distribution node for conducting data between the distribution node and a bay during operation. A data terminal is disposed in one of the bays and coupled to the distribution optical network conductors. The data terminal is configured to be coupled to a component in the respective bay to transmit data between the coupled component and an external network during operation.

The system may include a plurality of such distribution nodes, each coupled to a respective data terminal within a bay. Moreover, in certain embodiments, such distribution nodes may be provided only for the bays in which EtherNet and/or Internet connectivity is desired.

The invention also provides a method for making a motor control center that is based upon a cabinet subdivided into a plurality of bays and wireways, the bays being configured to house power electronic components that receive power from a source and control application of power to one or more loads. The method includes disposing wireway optical network conductors a wireway for conducting data during operation. A plurality of distribution nodes are coupled to the wireway optical network conductors. Distribution optical network conductors are coupled to the distribution nodes for conducting data between the respective distribution node and a bay during operation. A plurality of data terminals are disposed in the bays, each data terminal being coupled a respective distribution node via distribution optical network conductors. Each data terminal is configured to be coupled to a component in the respective bay to transmit data between the coupled component and an external network during operation.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
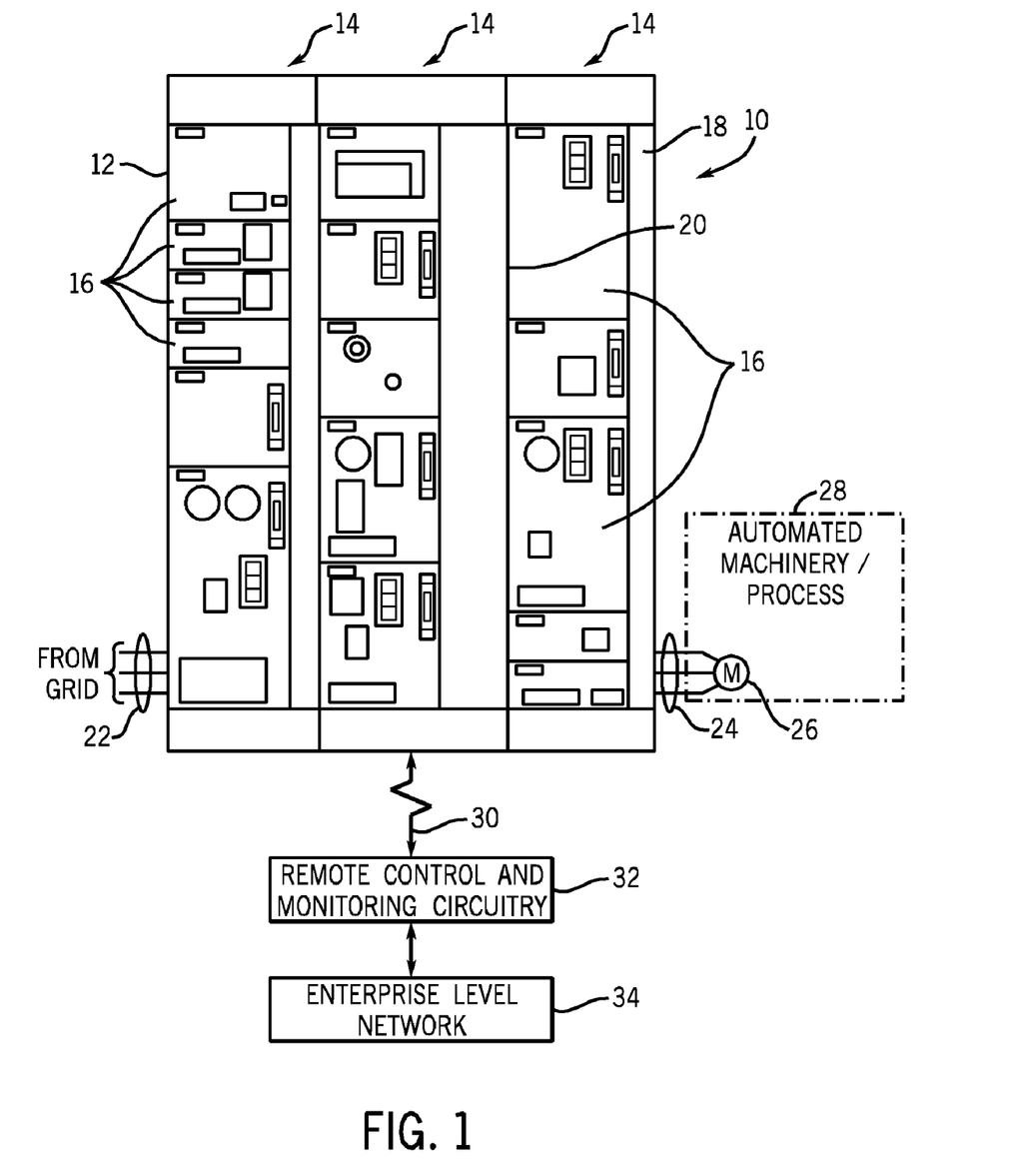
FIG. 1 is a diagrammatical representation of an exemplary MCC in which Internet or EtherNet media are routed for assisting and controlling and/or monitoring an automated machine or process.

FIG. 1 illustrates an exemplary MCC 10 as may be used in various industrial and automation applications. As will be appreciated by those skilled in the art, the MCC comprises a cabinet 12 that may be made up of one or more columns 14 of bays 16. Each bay is covered by a door that may be locked or latched to prevent entry during periods when the equipment within the enclosure is energized. In a typical application, many separate bays may be provided with separate doors, depending upon the particular components to be housed within the bays, their groupings and interconnection, their functionality in the application, and so forth. Running alongside the bays will be one or more wireways as indicated by reference numerals 18 and 20. In certain applications, as discussed in detail below, these wireways may be dedicated for either data, control power, load conductors, and so forth. In certain applications three-phase AC power may be conveyed in the same wireway with control power (e.g., 120 VAC in North America) and data conductors. In other applications, the three-phase power may be separated from the data conductors and the two positioned separately in dedicated wireways.

In a typical application, power will be applied to the MCC via three-phase power conductors as indicated by reference numeral 22 in FIG. 1. While these may draw power from any source, in most applications they will be coupled to the utility grid. In vehicular applications, ships, and other environments, however, power may be drawn from local power generation equipment. Within the MCC this power is distributed through a series of power busses (not shown) and made available to the components within each of the bays 16. In a typical application the power is applied to the various bays by power stabs that allow the bay to be plugged into the AC bus bars. Such arrangements are described more fully, for example, in U.S. Pat. Nos. 7,511,946, issued on Mar. 31, 2009 to Malkowski, Jr. et al., and 7,561,412, issued on Jul. 14, 2009 to Brandt et al., which are hereby incorporated into the present description by reference.

Depending upon the type of load and the type of control desired, the components within the bays will include circuit protection components, such as fuses, circuit breakers, and so forth, as well as power connection components, such as relays, contactors, and so forth. Particular control components, such as automation controllers, motor starters, motor controllers and drives, and so forth may also be housed in the bays and interconnected with other components for the desired control. As illustrated in FIG. 1, at some point power is output from the MCC, typically three-phase power as indicated by reference numeral 24. This power is then applied to one or more loads, such as a motor 26. The motor will perform some desired function within an automated machine or process as indicated by reference numeral 28. In many applications the automated machine or process may include many actuators, such as electric motors of various configuration and size, but also valves, linear actuators, and so forth. In such processes, multiple MCCs may be provided in the same or different locations and power routed to each device in accordance with the machine or process design.

The MCC illustrated in FIG. 1 is also coupled to a network as indicated by reference numeral 30 which utilizes an EtherNet and/or Internet protocol for data communication. It should be noted that the MCC may also be coupled to other networks, such as an industrial data exchange network, such as DeviceNet, ControlNet, Profibus, Modbus, and so forth. That is, certain functionality may be accomplished by communication within the MCC and between the MCC and external equipment by means of such industrial data exchange protocols, while other communications may take place via EtherNet or Internet protocols. The particular media used within the MCC to transmit data via the EtherNet or Internet protocol is described more fully below.

The network connection 30 allows the MCC to communicate with remote control and monitoring circuitry as indicated by reference numeral 32. In many applications, such circuitry may include automation controllers, coordinating control and/or monitoring equipment, plant or production line control equipment, and so forth. The MCC may communicate with computer equipment, such as special purpose workstations and general purpose computers by means of the EtherNet and/or Internet connectivity. That is, components within the MCC may be attributed an Internet protocol (IP) address so that certain data can be uploaded to devices within the MCC, downloaded from the devices, and so forth. As also illustrated in FIG. 1, the remote control and monitoring circuitry 32 may be part of or communicate with enterprise level networks as indicated by reference numeral 34. Such integration may allow for the control of production in the automated machine or process, monitoring of the process or machine, greater integration of the particular machine or process with other machines or processes in a plant, and so forth. Similarly, reporting at an enterprise level can be accomplished by interconnectivity with the particular components in the MCC and the enterprise level network.

Figure 2:
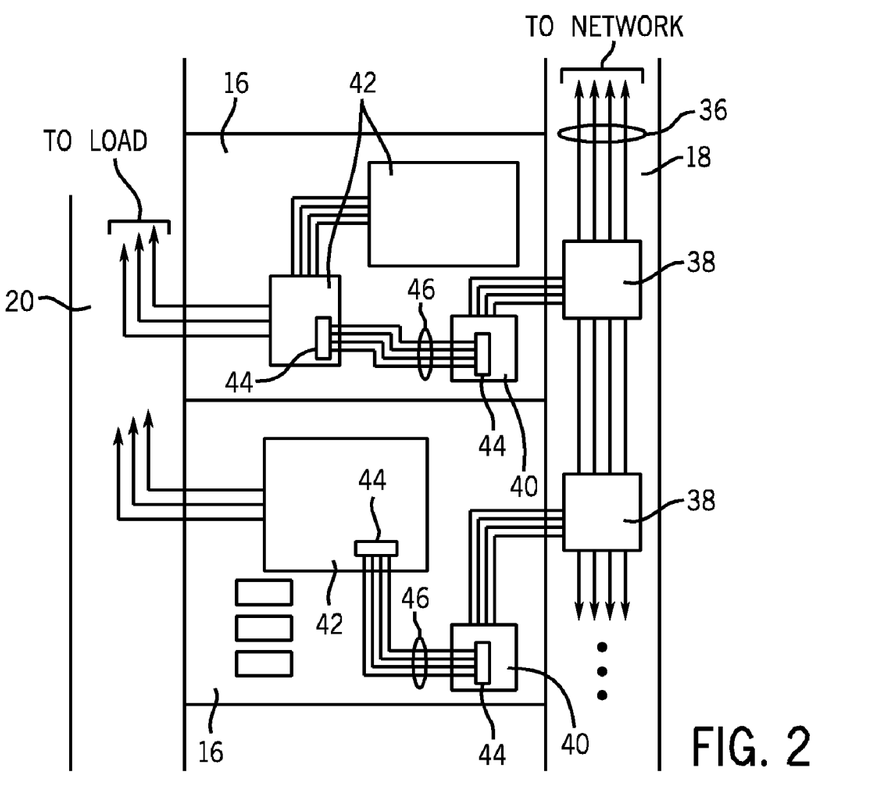
FIG. 2 is a diagrammatical representation of bays within an MCC and illustrating an exemplary technique for routing Internet or EtherNet media within a wireway and into individual bays.

FIG. 2 illustrates an exemplary embodiment of the MCC of FIG. 1 in which EtherNet and/or Internet network media is routed into individual bays of the MCC. In the diagrammatical illustration of FIG. 2 two such bays 16 are illustrated. In a physical implementation, the bays would typically be covered by individual doors and the components within the bays would be mounted on support structures, typically in the form of drawers that can be at least partially retracted from the bay for installation and servicing of the components. As discussed above, wireways 18 and 20 are routed on the sides of the bays. In this particular implementation wireway 18 serves for the transmission of networked data, while wireway 20 allows for the passage of three-phase power to driven loads. Control power may also be routed through one or both wireways, such as for actuation of devices such as relays, contactors, and so forth. It should be noted that in some implementations, the 3-phase powers and data conductors may be grouped in the same wireway.

In the illustration of FIG. 2, EtherNet conductors 36 are routed through wireway 18 and through distribution points or nodes 38. Each of these distribution points allows for pass through of data to further distribution points, or may serve as a terminal point for the conductors 36. Each of the distribution points also allows for tapping of the conductors for distribution of data to individual bays. In certain implementations, the conductors may form an EtherNet device level ring (DLR) that may be part of an integrated architecture system for high-speed, high-performance applications needing resilient networks. Such networks will allow for flexible, reliable, low-cost network solutions for real-time EtherNet/IP applications.

As will be appreciated by those skilled in the art, such DLR technology may utilize embedded switch functionality in automation end devices such as input/output modules and programmable automation controllers, to enable ring network topologies at a device level. Unlike network- or switch-level ring topologies that may provide resilience to the network infrastructure, DLR technologies will allow device-level networks resilience to optimize machine operation. For many of the components in the MCC, however, the component itself will originate information and may not be a pass-through device for the ring.

It should also be noted that in a presently contemplated embodiment, the network media used for the communications within the MCC comprise plastic optical fibers (POFs). As will be appreciated by those skilled in the art, such data transmission media consist of optical fibers made of a synthetic plastic material. As with other optical data transmission media, the fibers consist of a core material surrounded by a cladding that allows for highly efficient and reliable transmission of optical signals within the relatively high voltage environment of the MCC. Thus, conductors 36 may comprise of POFs as may the conductors within the individual bays or between components between within the bays. In the embodiment illustrated in FIG. 2, an in-bay POF terminal 40 is provided in those bays in which EtherNet or Internet data exchange is desired. These terminals are coupled to the distribution points 38 by data conductors which may also be POFs. Each bay will include one or more other components which serve to function for conditioning of power, automation of application of power to loads, power conversion, monitoring and control, and so forth. Here again, such components may include switchgear, relays, disconnects, automation controllers, motor drives, motor starters, and so forth. In the embodiment illustrated in FIG. 2, two bays are provided with EtherNet and/or Internet connectivity through the use of in-bay POF terminals. Certain components 42 are positioned within the bays, with one such component being coupled to the end-bay POF terminal 40 of each bay. In the embodiment illustrated in FIG. 2, a jumper cable 46 is coupled to connectors 44 that interface with each of the interconnected components. The cable 46 may be designed for use in high-voltage and high-electromagnetic interference environments, and is preferably suitable for use in an environment rated at 600 VAC.

Figure 3:
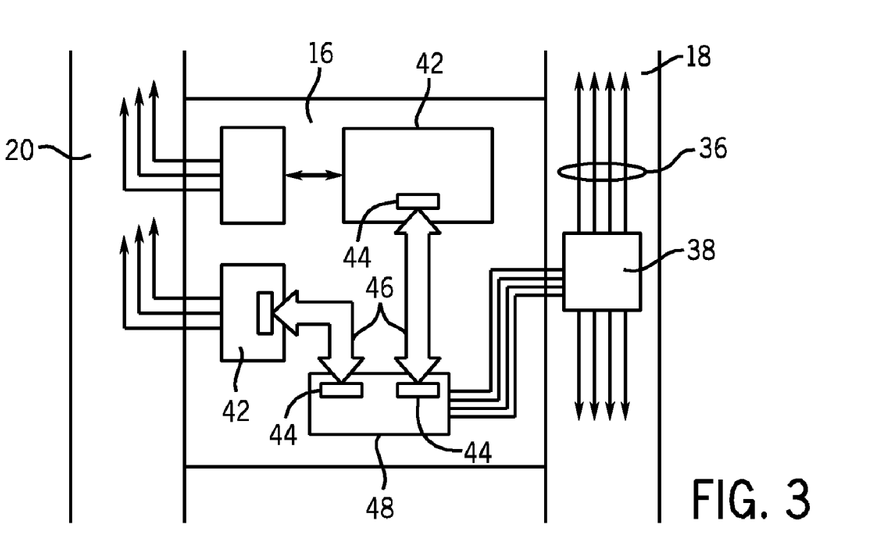
FIG. 3 is a similar diagrammatical representation illustrating the use of a router or similar device within an MCC bay.

A variant of the embodiment illustrated in FIG. 2 is shown in FIG. 3. In this embodiment multiple components are coupled to the distribution point 38 and positioned within a single bay. To allow for communication of data via EtherNet and/or Internet protocols, then, a router or gateway 48 is provided in the bay. This is, in turn, connected to the linked devices by means of cables 46 as discussed above. In a further alternative configuration not shown, the devices could be daisy-chained such that connectivity is provided through one device to a downstream device within the bay.

Figure 4:
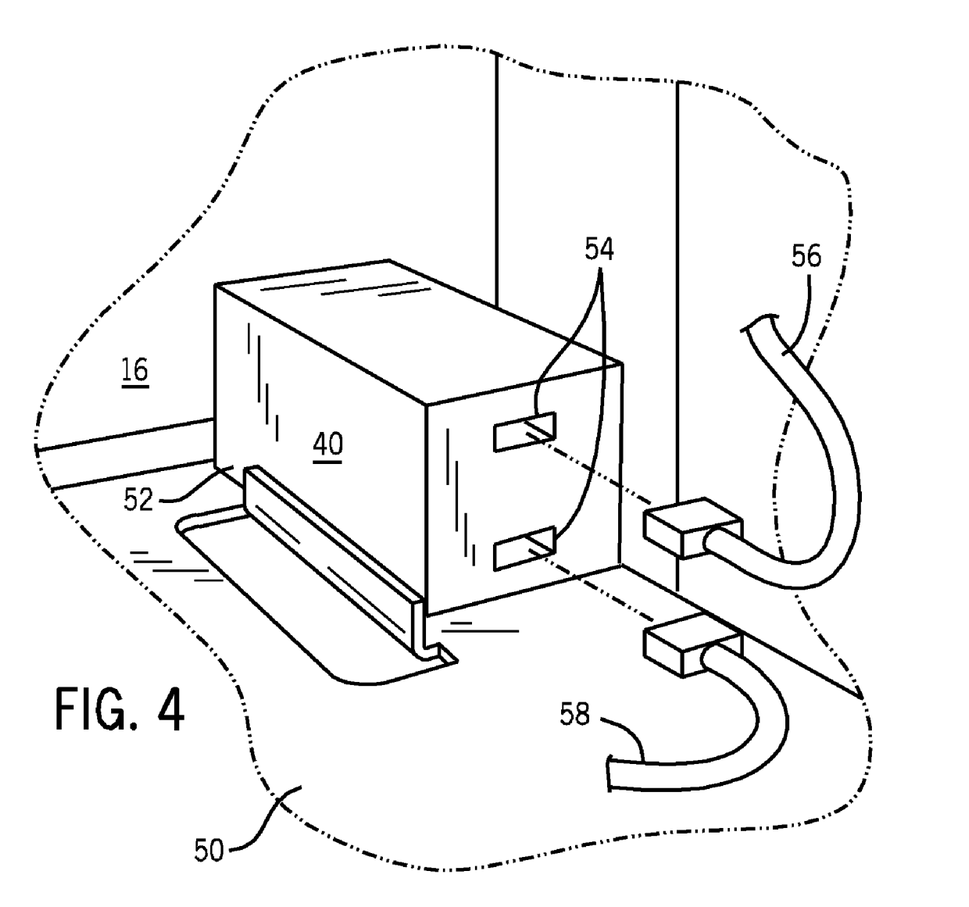
FIG. 4 is a partial representation of an exemplary physical implementation in which a network terminal is located within an MCC bay.

The arrangement illustrated in figures allows for simple distribution through an MCC wireway to those bays in which EtherNet and/or Internet connectivity is desired. An exemplary physical implementation for such applications is illustrated in FIG. 4. In particular, FIG. 4 illustrates a support pan 50 within an MCC enclosure with a component drawer or support removed (e.g., prior to assembly). In this embodiment, the pan is designed to hold and support the in-bay POF terminal 40. The terminal itself is housed in an enclosure 52 suitable for locating in the bay. The enclosure has receptacles 54 into which the individual EtherNet cables 56 and 58 may be plugged. This arrangement allows for simple installation and ready access to the cabling should the equipment need to be disconnected or serviced following installation and commissioning. In the illustrated embodiment, the terminal may remain in the bay on the support pan, and a corresponding recess may be formed in a support drawer that would be positioned in the bay, allowing the receptacles to be accessed for connection to the in-bay components.

In still a further embodiment, the EtherNet and/or Internet media may be distributed through a system that allows for plug-in connection when a bay is installed in the MCC, and that also allows for removing a bay to a service position. Such arrangements may allow for control power and data to be exchanged with certain components of the MCC although the components are withdrawn from three-phase power by partial removal of the support drawer in which they are positioned. Arrangements of this type are described, for example, in U.S. Pat. No. 7,419,394, issued on Sep. 2, 2008 to Jensen et al., which is hereby incorporated into the present disclosure by reference.

Figure 5:
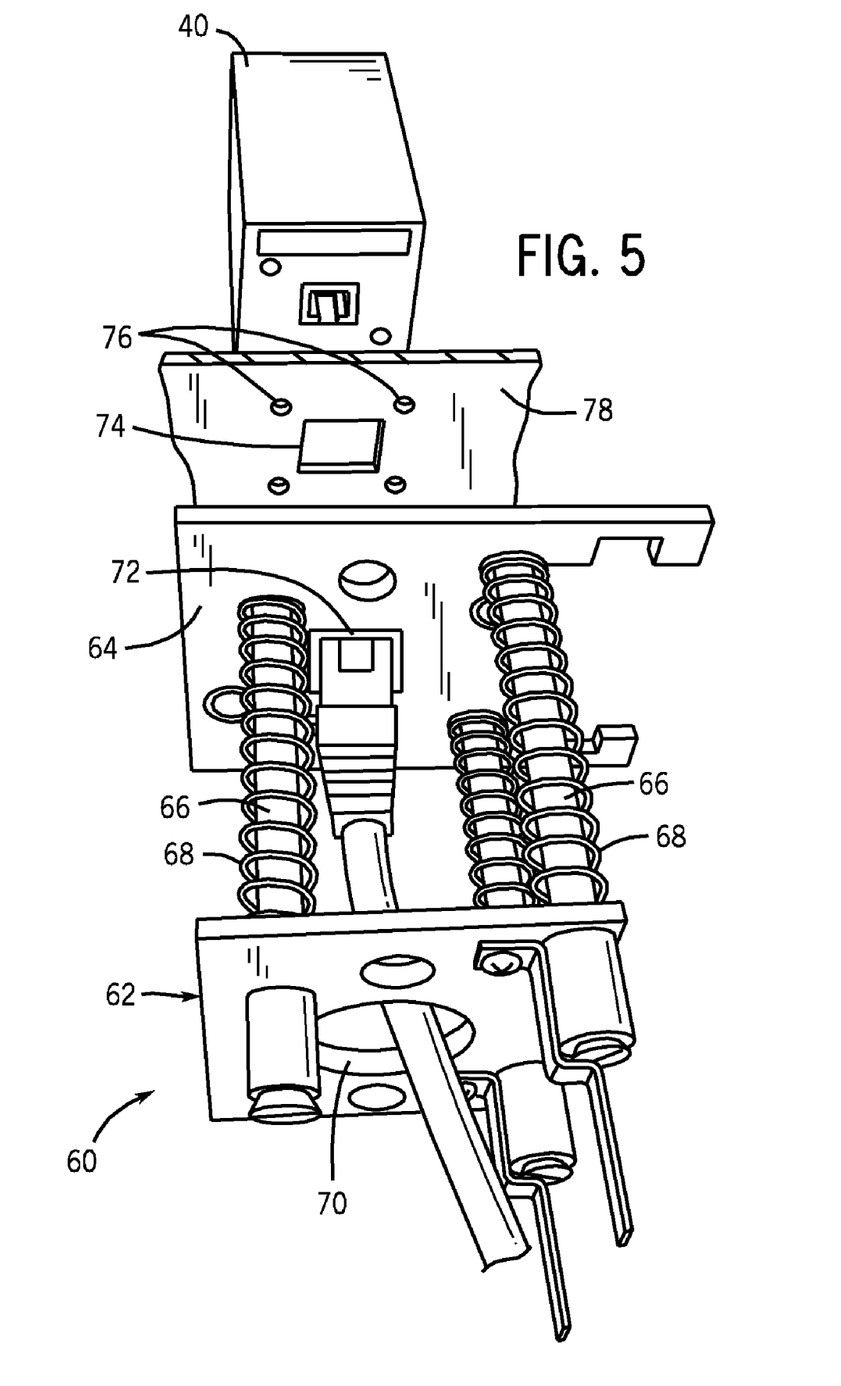
FIG. 5 is a perspective view of an exemplary Internet or EtherNet connection arrangement that permits a component support to be moved to a service position.

FIG. 5 is an exploded view of a presently contemplated arrangement that permits such connectivity. FIG. 5 illustrates a service position assembly 60 that allows for connection when the MCC drawer is positioned in the bay and fully engaged with three-phase power and other connections. The service position assembly 60 comprises a front plate 62 and a rear plate 64 connected to one another by alignment pins 66. Compression springs 68 separate the two plates along the pins and allow for compression for engagement of the assembly during installation. An aperture 70 is formed in front plate 62 and another aperture 72 is formed in rear plate 64. The aperture 70 allows for passage of an EtherNet cable, with a connector of the cable being positioned in the aperture 72 of the rear plate. Another aperture 74 is formed in a rear wall 78 of the MCC bay with further alignment pins 76 being provided adjacent to this (see FIG. 6). In the assembled structure, the in-bay POF terminal 40 is positioned behind the rear wall 78 and secured to the wall. The aperture 74 is generally aligned with the receptacle of the terminal and faces the connector of the cable.

Figure 6:
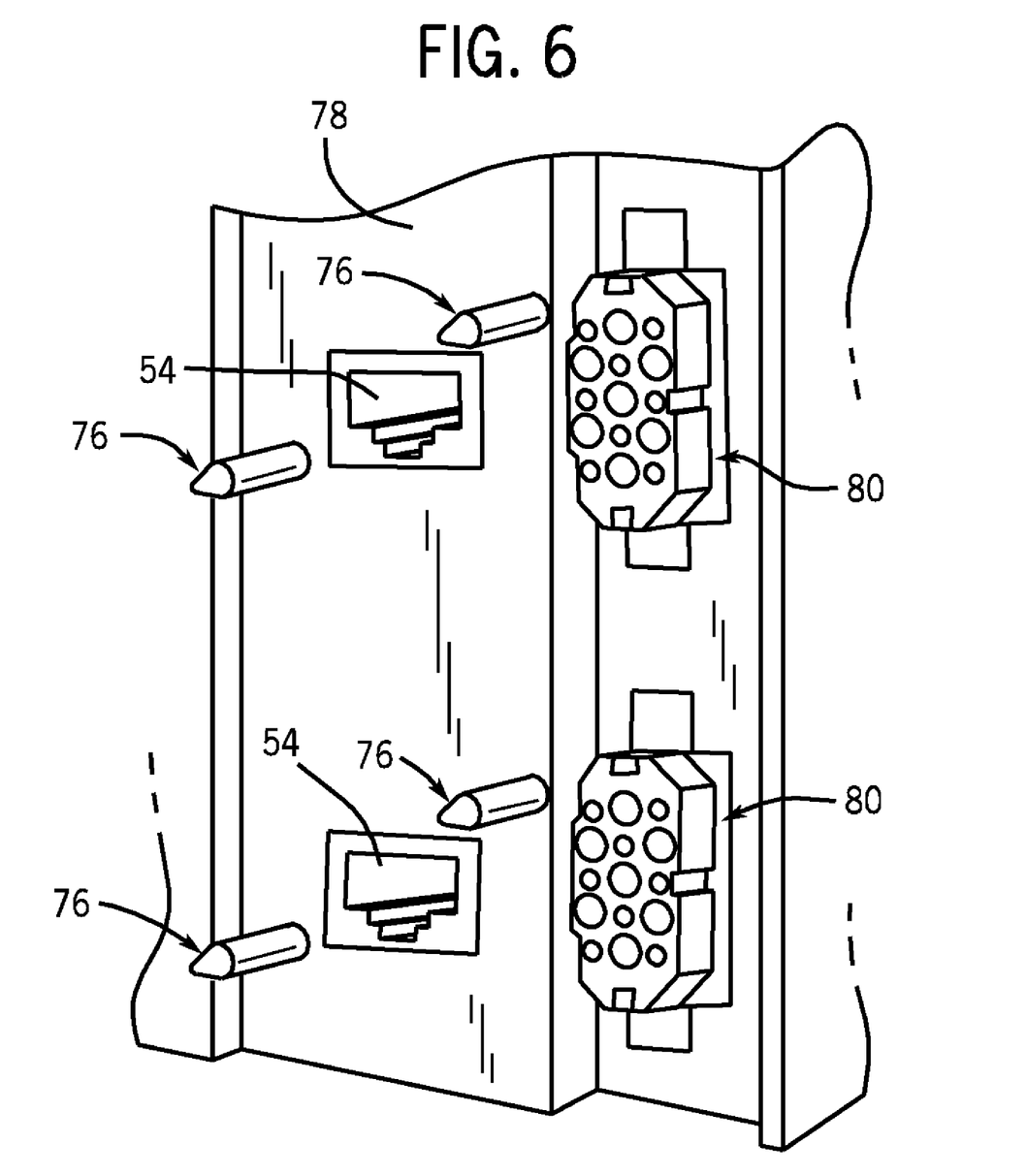
FIG. 6 is a perspective view of a portion of the same arrangement installed in a rear panel of an MCC.
Figure 7:
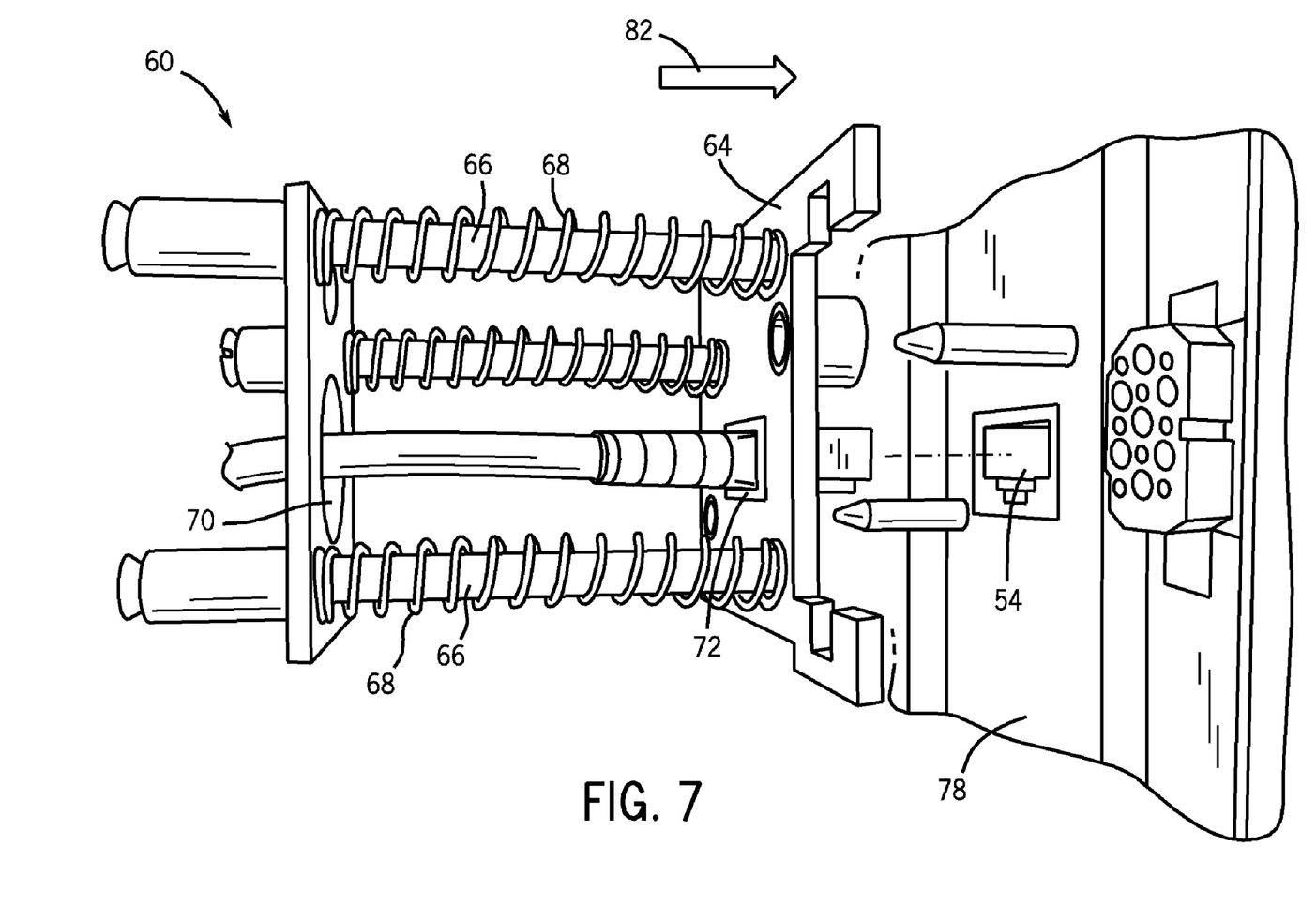
FIG. 7 is a perspective view of the arrangement of FIGS. 5 and 6 illustrating how the connection is made during assembly.

As best shown in FIG. 6, once assembled, the rear wall of the MCC presents the connector interface that is designed to receive the EtherNet connector. Other connectors 80 may be incorporated into the structure, such as for control power, low voltage DC power, and so forth. FIG. 7 illustrates the assembly positioned just prior to connection. As can be seen in this figure as the assembly is advanced toward the rear wall of the bay, in the direction of arrow 82, the alignment pins 76 guide the rear plate 64 into alignment such that the EtherNet connector is mated with the in-bay POF terminal receptacle 54. Other connections may be made at the same time, such as for control power. In this manner, EtherNet and/or Internet connectivity is made available by simply pressing the component support drawer into the respective bay to complete connections for both power and data communication. If the drawer is withdrawn to a service position, 3-phase electrical connections may be interrupted, while the service position assembly 60 allows for maintaining the network connection so long as the drawer is not withdrawn so far as to cause pins 66 to pull the rear plate 64 and cable connector out of engagement with the in-bay terminal.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A motor control center comprising:
   a cabinet subdivided into a plurality of bays and wireways, the bays being configured to house power electronic components that receive power from a source and control application of power to one or more loads, the wireways being configured to channel data and power conductors to the bays;
   wireway optical network conductors disposed in a wireway for conducting data during operation;
   at least one distribution node coupled to the wireway optical network conductors;

distribution optical network conductors coupled to the distribution node for conducting data between the distribution node and a bay during operation; and a data terminal disposed in one of the bays and coupled to the distribution optical network conductors, the data terminal being configured to be coupled to a component in the respective bay to transmit data between the coupled component and an external network during operation.

2. The motor control center of claim 1, wherein the wireway optical network conductors and the distribution optical network conductors comprise plastic optical fibers.

3. The motor control center of claim 1, wherein the wireway optical network conductors and the distribution optical network conductors comprise conductors suitable for transmission of EtherNet communications.

4. The motor control center of claim 1, comprising component optical network conductors coupled to the data terminal and to a component within the respective bay.

5. The motor control center of claim 4, wherein the component optical network conductors are disposed in a network cable rated for operation in at least a 600 VAC environment.

6. The motor control center of claim 1, comprising a plurality of distribution nodes coupled to the wireway optical network conductors, and a plurality of data terminals disposed in respective bays, each of the distribution nodes being coupled to a respective data terminal via distribution optical network conductors.

7. The motor control center of claim 1, wherein the distribution node is disposed in the same wireway as the wireway optical network conductors.

8. The motor control center of claim 1, comprising three phase power conductors disposed in a wireway for conveying power to a load.

9. The motor control center of claim 8, wherein the three phase power conductors and the wireway optical network conductors are disposed in different wireways.

10. The motor control center of claim 1, wherein the data terminal comprises a first receptacle configured to be coupled to the distribution optical fiber conductors and a second receptacle configured to be coupled to component optical fiber conductors.

11. The motor control center of claim 1, wherein the data terminal is configured to transmit data to a plurality of components within the respective bay.

12. The motor control center of claim 1, wherein the data terminal may be powered by a primary 24Vdc power supply and an isolated 24Vdc back-up power supply.

13. A motor control center comprising:
a cabinet subdivided into a plurality of bays and wireways, the bays being configured to house power electronic components that receive power from a source and control application of power to one or more loads, the wireways being configured to channel data and power conductors to the bays;
wireway optical network conductors disposed in a wireway for conducting data during operation;
a plurality of distribution nodes coupled to the wireway optical network conductors;
distribution optical network conductors coupled to the distribution nodes for conducting data between the respective distribution node and a bay during operation; and
a plurality of data terminals disposed in the bays, each data terminal being coupled a respective distribution node via distribution optical network conductors, each data terminal being configured to be coupled to a component in the respective bay to transmit data between the coupled component and an external network during operation.

14. The motor control center of claim 13, wherein the distribution nodes are disposed in the wireway with the wireway optical network conductors.

15. The motor control center of claim 13, wherein the wireway optical network conductors and the distribution optical network conductors comprise plastic optical fibers.

16. A method for making a motor control center, comprising:
in a cabinet subdivided into a plurality of bays and wireways, the bays being configured to house power electronic components that receive power from a source and control application of power to one or more loads, disposing wireway optical network conductors in a wireway for conducting data during operation;
coupling a plurality of distribution nodes to the wireway optical network conductors;
coupling distribution optical network conductors to the distribution nodes for conducting data between the respective distribution node and a bay during operation; and
disposing a plurality of data terminals in the bays, each data terminal being coupled a respective distribution node via distribution optical network conductors, each data terminal being configured to be coupled to a component in the respective bay to transmit data between the coupled component and an external network during operation.

17. The method of claim 16, wherein the distribution nodes are disposed in the wireway with the wireway optical network conductors.

18. The method of claim 16, wherein distribution nodes are only provided for bays in which a data terminal is disposed.

19. The method of claim 16, wherein the wireway optical network conductors and the distribution optical network conductors comprise plastic optical fibers.

20. The method of claim 16, wherein the wireway optical network conductors and the distribution optical network conductors comprise conductors suitable for transmission of EtherNet communications.

* * * * *